United States Patent [19]

Berner et al.

[11] Patent Number: 4,992,547
[45] Date of Patent: Feb. 12, 1991

[54] AMINOARYL KETONE PHOTOINITIATORS

[75] Inventors: Godwin Berner, Rheinfelden; Kurt Meier, Allschwil; Kurt Dietliker; Rinaldo Hüsler, both of Fribourg, all of Switzerland

[73] Assignee: Ciba-Geigy Corporation, Ardsley, N.Y.

[21] Appl. No.: 207,036

[22] Filed: Jun. 14, 1988

Related U.S. Application Data

[60] Division of Ser. No. 802,899, Nov. 27, 1985, abandoned, which is a continuation of Ser. No. 638,933, Aug. 9, 1984, abandoned.

[30] Foreign Application Priority Data

Aug. 15, 1983 [CH] Switzerland ............ 4430/83
Aug. 29, 1983 [CH] Switzerland ............ 4722/83

[51] Int. Cl.$^5$ ............ C07C 225/10; C07D 295/104; C07D 295/116; C08F 2/50
[52] U.S. Cl. ............ 544/162; 544/87; 544/175; 564/342; 522/8; 522/9; 522/14; 522/16; 522/24; 522/26; 522/50; 522/53; 522/81; 522/96; 522/101; 522/103
[58] Field of Search ............ 522/39; 544/87, 162, 544/175; 564/342

[56] References Cited

U.S. PATENT DOCUMENTS

| | | | |
|---|---|---|---|
| 3,641,040 | 2/1972 | Carney | 548/476 |
| 3,941,789 | 3/1976 | Renth | 544/29 S |
| 3,965,257 | 6/1976 | Carr | 514/255 |
| 3,975,525 | 8/1976 | Mentrup | 514/252 |
| 3,992,537 | 11/1976 | Mentrup | 514/255 |
| 4,017,652 | 4/1977 | Gruber | 427/54 |
| 4,038,279 | 7/1977 | Renth | 544/295 |
| 4,140,713 | 2/1979 | Oxford | 564/88 |
| 4,147,552 | 4/1979 | Specht | 522/14 |
| 4,247,623 | 1/1981 | Guild | 522/14 |
| 4,278,751 | 7/1981 | Specht | 522/16 |
| 4,284,485 | 8/1981 | Berner | 522/14 |
| 4,289,844 | 9/1981 | Specht | 522/18 |
| 4,318,791 | 3/1982 | Felder | 430/281 |
| 4,347,111 | 8/1982 | Gehlhaus | 526/208 |
| 4,351,948 | 9/1982 | Fellner | 548/336 |
| 4,390,453 | 6/1983 | Eichler | 252/426 |
| 4,419,434 | 12/1983 | Molaire | 430/403 |
| 4,485,161 | 11/1984 | Scozzafava | 522/104 |
| 4,505,793 | 3/1985 | Tamoto | 430/281 |
| 4,578,339 | 3/1986 | Adkins | 430/211 |
| 4,582,862 | 4/1986 | Berner | 522/14 |
| 4,600,678 | 7/1986 | Adair | 430/338 |

FOREIGN PATENT DOCUMENTS 88050 9/1983 European Pat. Off. .

Primary Examiner—Marion C. McCamish
Assistant Examiner—Arthur H. Koeckert
Attorney, Agent, or Firm—Luther A. R. Hall

[57] ABSTRACT

The photopolymerizable mixture described contains
(A) at least one ethylenically unsaturated photopolymerisable compound,
(B) a photoinitiator of the formula I

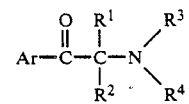

and
(C) a photosensitiser from the group of aromatic carbonyl compounds having a triplet energy of 225-310 kJ/mol, for example xanthones, thioxianthones, coumarins, phthalimides, phenones and the like.

Ar is phenyl substituted in the 4-position by a substituted amino group, $R^1$ and $R^2$ are alkyl, $R^3$ and $R^4$ are alkyl or alkoxyalkyl, or $R^3$ and $R^4$ together are 3-oxapentamethylene. Said sensitisers (C) raise the activity of said photoinitiators (B) without shortening the shelf life of the mixtures. The photocurable mixtures are used especially as binders for printing inks or paints.

5 Claims, No Drawings

AMINOARYL KETONE PHOTOINITIATORS

This is a divisional of application Ser. No. 802,899, filed on Nov. 27, 1985, now abandoned, which in turn is a continuation of application Ser. No. 638,933, filed on Aug. 9, 1984, now abandoned.

The invention relates to photocurable mixtures based on ethylenically unsaturated photopolymerisable compounds and a synergistic combination of a specific photoinitiator and of a photosensitiser.

Photoinitiators for compounds which are polymerisable in free-radical reactions are compounds which, on irradiation with short-wave light, disintegrate into free-radical fragments which are the actual initiators for the polymerisation of the ethylenically unsaturated compound. Examples of known photoinitiators are in particular aromatic carbonyl compounds, for example benzil, benzoin, benzoin ether, benzil monoketals, α-halogenoacetophenones or α-alkoxyacetophenones. It is known from U.S. Pat. No. 4,017,652 that the activity of such aromatic carbonyl photoinitiators can be raised considerably by adding as a co-catalyst an aromatic carbonyl compound which, on irradiation, can undergo transition into an excited state (a triplet state) without splitting into free radicals. These co-catalysts, which are also referred to as photosensitisers, are capable of transferring their energy to the photoinitiator, provided their triplet energy is within the correct range. Said U.S. patent proposes the use of aromatic carbonyl compounds having a triplet energy of about 54–72 kcal/mol (225–300 kJ/mol), in particular benzophenone.

A relatively new class of photoinitiators consists of aryl sec.-alkyl ketones which are substituted in the α-position by an oxygen or amine function and can be represented by the general formula

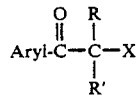

where R and R' are organic radicals, preferably alkyl radicals, and X can be (a) a free, etherified, esterified or silylated hydroxyl group or (b) an amino group. These compounds and their use as photoinitiators have been described in European Patent A-3002 and German Offenlegungsschrift 2,722,264. Of these compounds, those of type (a) are generally much more reactive than the compounds of type (b). Both types can be made more active by adding sensitisers. For instance, combining type (a) with 2-alkylthioxanthones is said, in German Offenlegungsschrift 3,010,148, to increase the activity. However, it was found, surprisingly, that the compounds of type (b) can be sensitised particularly readily by means of, in general, aromatic carbonyl compounds having triplet energies of 225–310 kJ/mol, in particular 225–276 kJ/mol. In many cases this has the effect of reversing the abovementioned reactivity relationship. While, for example, a compound where X=OH is on its own generally more active than its analogue where X=—N(CH$_3$)$_2$, the amino compound is superior to the hydroxyl compound if such a sensitiser is present.

The invention accordingly provides photopolymerisable mixtures containing (A) at least one ethylenically unsaturated photopolymerisable compound, (B) at least one photoinitiator of the formula I or II

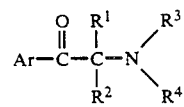

in which Ar is a phenyl, biphenylyl or benzoylphenyl group which is unsubstituted or substituted by one or more of the radicals halogen, $C_1$–$C_{12}$-alkyl, $C_3$–$C_{12}$-alkenyl, $C_5$–$C_6$-cycloalkyl, $C_7$–$C_9$-phenylalkyl, —COOH, —COO($C_1$–$C_4$-alkyl), —OR$^5$, methylenedioxy, —SH, —SR$_6$, —SO—R$^6$, —SO$_2$—R$^6$, —CN, —SO$_2$NH$_2$, —SO$_2$NH($C_1$–$C_4$-alkyl), —SO$_2$—N($C_1$–$C_4$-alkyl)$_2$, —N(R$^7$)(R$^8$) —NH-CO—R$^9$ or by a group of the formula

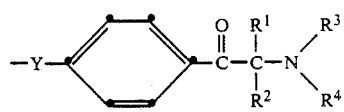

or is a group of the formula III, IV or V

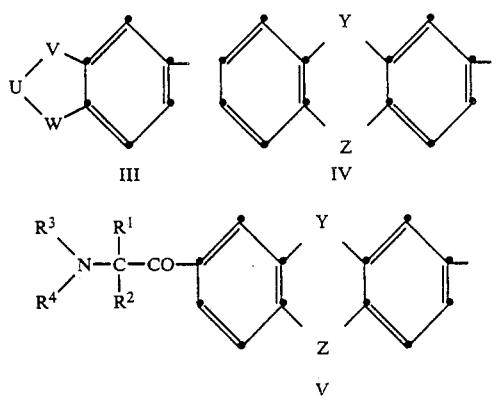

in which U is unbranched or branched $C_1$–$C_7$-alkylene, V is a direct bond, —O—, —S— or —N(R$^{1-}$$^0$)—, W is a direct bond, —O—, —S— or —N(R$^{1-}$$^0$)—, X is a divalent radical of the formulae

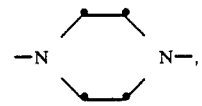

—N(R$^{11}$)— or —N(R$^{11}$)—(CH$_2$)$_m$—N(R$^{11'}$)— where m=1–8, Y is a direct bond, —CH$_2$—, —CH$_2$CH$_2$—, —O—, —S—, —CO— or —N(R$^{1-}$$^0$)—, Z is a direct bond, provided Y is not a direct bond at the same time, or is —CH$_2$—, —CH$_2$CH$_2$—, —O—, —S—, —CO— or —N(R$^{10}$)—, R$^1$ and R$^2$, independently of each other, are each $C_1$–$C_8$-alkyl, OH—, $C_1$–$C_4$-alkoxy-, —CN—, —COO($C_1$–$C_8$-alkyl)-, ($C_1$–$C_4$-alkyl)—COO— or —N(R$^3$)(R$^4$)-substituted $C_1$–$C_4$-alkyl, $C_3$–$C_6$-alkenyl, phenyl, chlorophenyl, R$^5$-O-phenyl, R$^6$-S-phenyl or $C_7$–$C_9$-phenylalkyl, or R$^1$ and R$^2$ together are unbranched or branched $C_2$–$C_9$-alkylene or $C_3$–$C_9$-oxaalkylene or -azaalkylene, R$^3$ and R$^4$, independently of each other, are each hydrogen, $C_1$–$C_{12}$-alkyl, OH—, $C_1$–$C_4$-alkoxy-, —CN— or —COO($C_1$-$C_4$-alkyl)-monosubstituted or -polysubstituted $C_2$-$C_4$-alkyl, $C_3$-$C_5$-alkenyl, cyclohexyl, $C_7$-$C_9$-phenylalkyl, phenyl or Cl—, OH—, $C_1$-$C_{12}$-alkyl-, $C_1$-$C_4$-alkoxy- or —COO($C_1$-$C_4$-alkyl)-substituted phenyl, or $R^3$ and $R^4$ together are $C_3$-$C_7$-alkylene which can be interrupted by —O—, —S— or —N($R^{12}$)-, or $R^4$, together with $R^2$ is $C_1$-$C_7$-alkylene, $C_7$-$C_{10}$-phenylalkylene, o-xylylene or $C_1$-$C_3$-oxaalkylene or -azaalkylene, $R^5$ is hydrogen, $C_1$-$C_{12}$-alkyl, $C_3$-$C_{12}$-alkenyl, cyclohexyl, hydroxycyclohexyl, Cl—, Br—, CN—, SH—, —N($C_1$-$C_4$-alkyl)$_2$—, piperidino-, morpholino-, OH—, —O($C_1$-$C_4$-alkyl)-, —OCH$_2$CH$_2$-CN—, —OCH$_2$CH$_2$COO($C_1$-$C_4$-alkyl)-, —OOC—$R^9$—, —COOH—, —COO($C_1$-$C_8$-alkyl)-, —CONH($C_1$-$C_4$-alkyl)-, —CON($C_1$-$C_4$-alkyl)$_2$—,

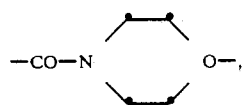

—CO—($C_1$-$C_4$-alkyl)-or —CO-phenyl-monosubstituted or -polysubstituted $C_1$-$C_4$-alkyl, 2,3-epoxypropyl, —(CH$_2$CH$_2$O)$_n$—H where n=2-20, phenyl, $C_7$-$C_9$-phenylalkyl, halogen-, $C_1$-$C_4$-alkyl-, $C_1$-$C_4$-alkoxy-or —COO($C_1$-$C_4$-alkyl)-substituted phenyl, tetrahydropyranyl, tetrahydrofuranyl, a group of the formula —CO—$R^9$, —COO($C_1$-$C_8$-alkyl), —CONH($C_1$-$C_4$-alkyl), —CON($C_1$-$C_4$-alkyl)$_2$, —Si($R^{13}$)($R^{14}$)$_2$ or —SO$_2$—$R^{15}$, $R^6$ is $C_1$-$C_{12}$-alkyl, $C_3$-$C_{12}$-alkenyl, cyclohexyl, hydroxycyclohexyl, Cl—, Br—, CN—, SH—, —N($C_1$-$C_4$-alkyl)$_2$—, piperidino-, morpholino-, —OH—, —O($C_1$-$C_4$-alkyl)-, —OCH$_2$-CH$_2$—CN—, —OCH$_2$CH$_2$COO($C_1$-$C_4$-alkyl)-, —OOC—$R^9$—, —COOH—, —COO($C_1$-$C_8$-alkyl)-, —CON($C_1$-$C_8$-alkyl)$_2$—,

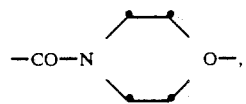

—CO—($C_1$-$C_4$-alkyl)- or —CO-phenyl-monosubstituted or -polysubstituted $C_1$-$C_4$-alkyl, 2,3-epoxypropyl, phenyl, $C_7$-$C_9$-phenylalkyl, $C_7$-$C_9$-phenylhydroxyalkyl, halogen-, $C_1$-$C_4$-alkyl-, $C_1$-$C_4$-alkoxy- or —COO($C_1$-$C_4$-alkyl)-substituted phenyl, 2-benzothiazolyl, 2-benzimidazolyl, —CH$_2$CH$_2$—O—CH$_2$CH$_2$—SH or —CH$_2$CH$_2$—S—CH$_2$CH$_2$—SH, $R^7$ and $R^8$, independently of each other, are each hydrogen, $C_1$-$C_{12}$-alkyl, —OH—, $C_1$-$C_4$-alkoxy-, —CN— or —COO($C_1$-$C_4$-alkyl)-monosubstituted $C_2$-$C_4$-alkyl, $C_3$-$C_5$-alkenyl, cyclohexyl, $C_7$-$C_9$-phenylalkyl, phenyl or $C_1$-$C_{12}$-alkyl- or halogen-monosubstituted or -polysubstituted phenyl, or $R^7$ and $R^8$ together are $C_2$-$C_7$-alkylene which can be interrupted by —O—, —S— or —N($R^{12}$)—, $R^9$ is $C_1$-$C_4$-alkyl, $C_2$-$C_4$-alkenyl or phenyl, $R^{10}$ is hydrogen, $C_1$-$C_4$-alkyl, allyl, benzyl or $C_1$-$C_4$-hydroxyalkyl, $R^{11}$ and $R^{11'}$ are each hydrogen, $C_1$-$C_9$-alkyl, $C_1$-$C_4$-hydroxyalkyl, cyclohexyl or benzyl, $R^{12}$ is hydrogen, $C_1$-$C_4$-alkyl, allyl, benzyl, $C_1$-$C_4$-hydroxyalkyl, —CH$_2$CH$_2$CN or —CH$_2$CH$_2$—COO($C_1$-$C_4$-alkyl), $R^{13}$ and $R^{14}$ are each $C_1$-$C_4$-alkyl or phenyl and $R^{15}$ is $C_1$-$C_{18}$-alkyl, phenyl or $C_7$-$C_{20}$-alkylphenyl, and (C) a photosensitiser from the group of aromatic carbonyl compounds having a triplet energy of 225-310 kJ/mol.

Said component (A) can consist of one or more unsaturated compounds. The mixture preferably contains two or three unsaturated photopolymerisable compounds. The unsaturated compounds can contain one or more olefinic double bonds. They can be of low molecular weight (monomeric) or higher molecular weight (oligomeric). Examples of monomers having one double bond are alkyl or hydroxyalkyl acrylates or methacrylates, such as methyl, ethyl, butyl, 2-ethylhexyl and 2-hydroxyethyl acrylates, isobornyl acrylate, and methyl or ethyl methacrylates. Further examples thereof are acrylonitrile, acrylamide, methacrylamide, N-substituted (meth)acrylamides, vinyl esters such as vinyl acetate, vinyl ethers such as isobutyl vinyl ether, styrene, alkylstyrenes, halogenostyrenes, N-vinylpyrrolidone, vinyl chloride and vinylidene chloride.

Examples of monomers having more than one double bond are ethylene glycol, propylene glycol, neopentylglycol, hexamethylene glycol and bisphenol A diacrylates, 4,4'-bis(2-acryloyloxyethoxy)-diphenylpropane, trimethylolpropane triacrylate, pentaerythritol triacrylate or tetraacrylate, vinyl acrylate, divinylbenzene, divinyl succinate, diallyl phthalate, triallyl phosphate, triallyl isocyanurate and tris(2-acryloyloxyethyl) isocyanurate.

Examples of higher molecular weight (oligomeric) polyunsaturated compounds are acrylated epoxy resins, acrylated polyethers, acrylated polyurethanes and acrylated polyesters. Further examples of unsaturated oligomers are unsaturated polyester resins, usually prepared from maleic acid, phthalic acid and one or more diols and having molecular weights of about 500 to 3000. These unsaturated oligomers can also be called prepolymers.

Frequently use is made of a two-component mixture of a prepolymer with a polyunsaturated monomer or of three-component mixtures which additionally contain a monounsaturated monomer. In these mixtures, the prepolymer is primarily responsible for the properties of the applied film, so that by varying the prepolymer the properties of the cured film can be affected. The polyunsaturated monomer acts as the crosslinking agent which renders the applied film insoluble. The monounsaturated monomer acts as a reactive diluent with which the viscosity is reduced without recourse to a solvent.

These prepolymer-based two- and three-component systems are used not only for printing inks but also for surface finishes, photoresists or other photocurable compositions. Frequently the binders used in printing inks can also be one-component systems based on photocurable prepolymers.

Unsaturated polyester resins are usually used in two-component systems, namely together with a monounsaturated monomer, preferably with styrene. Photoresists are frequently prepared with specific one-component systems, for example polymaleimides, polychalcones of polyimides of the type described in German Offenlegungsschrift 2,308,830.

The mixture can also contain non-photopolymerisable film-forming components. These can be for example physically drying polymers or their solutions in organic solvents, for example nitrocellulose or cellulose acetobutyrate However, they can also be chemically or thermally curable resins, for example polyisocyanates, polyepoxides or melamine resins. The presence of thermally curable resins is of importance for the use in so-called hybrid systems which are photopolymerised in a first step and are crosslinked by thermal aftertreatment in a second step.

Furthermore, the mixtures can also contain synthetic rubbers. Insofar as they contain ethylenically unsaturated bonds they can take part in the photopolymerisation. These mixtures are of interest for preparing resilient printing plates.

The photoinitiator in the mixture should be at least one aminoketone of the formula I or II as defined above in which $C_1$–$C_8$-alkyls $R^1$ and $R^2$ can be for example methyl, ethyl, propyl, isopropyl, n-butyl, isobutyl, n-pentyl, isopentyl, n-hexyl, 2-ethylbutyl, n-heptyl or n-octyl. Substituted alkyls $R^1$ and $R^2$ can be for example hydroxymethyl, 2-hydroxyethyl, 2-methoxyethyl, 2-ethoxybutyl, 2-cyanoethyl, ethoxycarbonylmethyl, 2-methoxycarbonylethyl, 2-butoxycarbonylisopropyl, 2-acetoxyethyl, 2-butyroyloxypropyl, 2-dimethylaminoethyl, 3-diethylaminopropyl or 2-di(2-hydroxy-ethyl)aminoethyl. $C_3$–$C_6$-Alkenyls $R^1$ and $R^2$ can be in particular alkenylmethyl, for example allyl, methallyl, ethallyl or 2-butenyl. $R^5O$-Phenyls or $R^6S$-phenyls $R^1$ and $R^2$ can be for example 3-methoxyphenyl, 4-hydroxyphenyl, 4-mercaptophenyl or 4-tert-butylmercaptophenyl.

Alkylene, oxaalkylene or azaalkylene $R^1$ together with $R^2$ is together with the C atom to which they are bonded a saturated ring, for example a cyclopropane, cyclopentane, cyclohexane, cyclooctane, 3-methylcyclohexane, 4-ethylcyclohexane, tetrahydropyran, tetrahydrofuran, pyrrolidine, piperidine or 2-ethylpiperidine ring.

Alkyls $R^3$ and $R^4$ are for example methyl, ethyl, propyl, isopropyl, butyl, hexyl, octyl or dodecyl. Substituted alkyls $R^3$ and $R^4$ are for example 2-hydroxyethyl, 2-hydroxypropyl, 2-methoxyethyl, 3-butoxypropyl, 2-cyanoethyl, ethoxycarbonylmethyl or 2-methoxycarbonylethyl.

Alkenyls $R^3$ and $R^4$ are in particular alkenylmethyl, for example allyl, methallyl, ethallyl or 2-butenyl. Phenylalkyls $R^3$ and $R^4$ can be for example benzyl, phenylethyl or phenylpropyl. Alkylene and heteroatom-interrupted alkylene $R^3$ together with $R^4$ is together with the N atom a ring, for example a pyrrolidine, methylpyrrolidine, piperidine, ethylpiperidine, dimethylpiperidine, morpholine, thiomorpholine, piperazine, 4-methylpiperazine or 4-(cyanoethyl)piperazine ring.

Alkylene, phenylalkylene, o-xylylene, oxaalkylene or azaalkylene $R^4$ together with $R^2$ is together with the N atom and the C atom to which they are bonded a ring, for example a pyrrolidine, piperidine, oxazolidine, morpholine, imidazolidine or piperazine ring which can be substituted by alkyl or phenyl or be fused on a benzo radical.

$C_1$–$C_{12}$-alkyls $R^5$ and $R^6$ can be any of the unbranched or branched alkyl radicals mentioned for $R^3$ and $R^4$. $C_3$–$C_{12}$-alkenyls $R^5$ and $R^6$ can be in particular alkenylmethyl, for example allyl, methallyl, 2-butenyl, 2-pentenyl, 3-methyl-2-butenyl or 2-heptenyl. Substituted alkyls $R^5$ and $R^6$ can be for example 2-chloroethyl, 2-bromopropyl, 2-cyanoethyl, 2-mercaptopropyl, 3-(dimethylamino)propyl, 2-morpholinobutyl, 2-hydroxyethyl, 2,3-dihydroxypropyl, 2-hydroxybutyl, 2-methoxypropyl, 2-ethoxyethyl, 2-(2-cyanoethoxy)-ethyl, 2-(2-methoxycarbonylethoxy)-ethyl, 2-acetoxypropyl, 2-propionyloxyethyl, 2-methoxycarbonylethyl, 2-butoxycarbonylpropyl, ethoxycarbonylmethyl, 2-(dimethylaminocarbonyl)-ethyl, 2-morpholinocarbonylpropyl, 2-acetylethyl or benzoylmethyl. Substituted phenyls $R^5$ and $R^6$ can be for example 4-chlorophenyl, 3-bromophenyl, 4-tolyl, 4-tert.-butylphenyl, 3-methoxyphenyl, 2-chloro-4-methylphenyl, 3-methoxy-5-chlorophenyl, 4-butoxycarbonylphenyl or 3-methoxycarbonylphenyl. Phenylalkyls $R^5$ and $R^6$ can be for example benzyl, 1-phenylethyl, 2-phenylethyl or 1-phenylisopropyl.

$C_1$–$C_4$-Alkyls $R^9$, $R^{10}$, $R^{12}$, $R^{13}$ and $R^{14}$ can be methyl, ethyl, n-propyl, isopropyl, n-butyl, sec.-butyl, isobutyl or tert.-butyl. $C_2$–$C_4$-Alkenyl $R^9$ can be for example vinyl, isopropenyl or 1-propenyl.

Alkyls $R^7$ and $R^8$ can be for example methyl, ethyl, propyl, isopropyl, butyl, hexyl, octyl or dodecyl. Substituted alkyls $R^7$ and $R^8$ can be for example 2-hydroxyethyl, 2-hydroxypropyl, 2-methoxyethyl, 2-cyanoethyl or 2-methoxycarbonylethyl. Alkenyls $R^7$ and $R^8$ are in particular allyl. Phenylalkyls $R^7$ and $R^8$ are in particular benzyl or phenylethyl.

Alkylene or heteroatom-interrupted alkylene $R^7$ together with $R^8$ is together with the N atom a heterocyclic ring, for example a pyrrolidine, piperidine, morpholine, 2,6-dimethylmorpholine, piperazine, 4-methylpiperazine or 4-(cyanoethyl)-piperazine ring.

$C_1$–$C_9$-Alkyls $R^{11}$ and $R^{11'}$ can be any of the radicals listed for $R^9$ and also unbranched or branched pentyl, hexyl, heptyl, octyl or nonyl. An alkyl $R^{15}$ moreover can also be for example decyl, dodecyl, hexadecyl or octadecyl.

Hydroxyalkyls $R^{10}$, $R^{11}$, $R^{11'}$ and $R^{12}$ can be for example hydroxymethyl, 2-hydroxyethyl, 2-hydroxybutyl or 3-hydroxypropyl.

A $C_7$–$C_{20}$-alkylphenyl $R^{15}$ can be for example 4-tolyl, 4-hexylphenyl, 4-dodecylphenyl, nonylnaphthyl or dibutylphenyl.

Component (B) in the photopolymerisable mixture is preferably a photoinitiator of the formula I or II in which Ar is a phenyl, biphenylyl or benzoylphenyl group which is unsubstituted or substituted by one or more of the radicals halogen, $C_1$–$C_{12}$-alkyl, $C_3$–$C_{12}$-alkenyl, $C_5$–$[_6$-cycloalkyl, $C_7$–$C_9$-phenylalkyl, —COOH, —COO($C_1$–$C_4$-alkyl), —SO$_2$—R$^6$, —CN, —SO$_2$NH$_2$, —SO$_2$NH($C_1$–$C_4$-alkyl), —SO$_2$—N(-$C_1$–$C_4$-alkyl)$_2$, —N(R$^7$) or —NHCO—R$^9$ or by a group of the formula

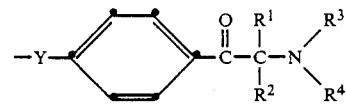

Y is a direct bond, —CH$_2$—, —CH$_2$CH$_2$—, —CO— or —N(R$^{10}$)—, and X, R$^1$, R$^2$, R$^3$, R$^4$, R$^6$, R$^7$, R$^8$, R$^9$ and R$^{10}$ are as defined above.

In other preferred mixtures component (B) is a photoinitiator of the formula I or II in which Ar is a phenyl or 4-benzoylphenyl group which is unsubstituted or substituted by chlorine, $C_1$–$C_4$-alkyl, methylenedioxy, —OR$^5$, —SR$^6$ or —N(R$^7$)(R$^8$) or by a group of the formula

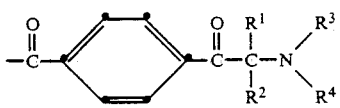

X is a radical of the formula

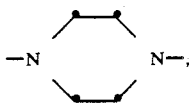

$R^1$ and $R^2$, independently of each other, are each $C_1$–$C_4$-alkyl, —$CH_2CH_2COO(C_1$–$C_4$-alkyl), allyl or benzyl or $R^1$ and $R^2$ together are unbranched $C_4$–$C_5$-alkylene, $R^3$ and $R^4$, independently of each other, are each $C_1$–$C_{12}$-alkyl, OH—, $C_1$–$C_4$-alkoxy-, CN— or —COO($C_1$–$C_4$-alkyl)-substituted $C_2$–$C_4$-alkyl, allyl, cyclohexyl or benzyl, or $R^3$ and $R^4$ together are $C_4$–$C_6$-alkylene which can be interrupted by —O— or —N($R^{12}$)—, $R^5$ is $C_1$–$C_4$-alkyl, 2-hydroxyethyl, 2,3-epoxypropyl, phenyl or benzyl, $R^6$ is $C_1$–$C_{12}$-alkyl, allyl, cyclohexyl, OH—, —COO($C_1$–$C_8$-alkyl)-or —N($CH_3$)$_2$-substituted $C_1$–$C_4$-alkyl, benzyl, phenyl, p-tolyl or —$CH_2C$-$H_2OCH_2CH_2SH$, $R^7$ and $R^8$, independently of each other, are each $C_1$–$C_4$-alkyl, —OH—, $C_1$–$C_4$-alkoxy-, —CN— or —COO($C_1$–$C_4$-alkyl)-substituted $C_2$–$C_4$-alkyl, cyclohexyl or allyl, or $R^7$ and $R^8$ together are $C_4$–$C_6$-alkylene which can be interrupted by —O— or —N($R^{12}$)—, and $R^{12}$ is hydrogen, $C_1$–$C_4$-alkyl or $C_2$–$C_4$-hydroxyalkyl, in particular containing a photoinitiator of the formula I in which Ar is a phenyl radical which is unsubstituted or substituted in the 4-position by chlorine, methyl, methoxy, methylthio, dialkylamino or morpholino, $R^1$ and $R^2$ are each $C_1$–$C_4$-alkyl and $R^3$ and $R^4$ are each $C_1$–$C_4$-alkyl or 2-methoxyethyl or $R^3$ and $R^4$ together with the N atom are morpholine.

Examples of individual compounds of the formula I are

1-[4-(2-hydroxyethylthio)phenyl]-2-methyl-2-morpholinopropan-1-one,
2-methyl-1-[4-(methylthio)phenyl]-2-morpholinopropan-1-one,
1-(4-mercaptophenyl)-2-methyl-2-morpholinopropan-1-one,
1-(4-allylthiophenyl)-2-methyl-2-morpholinopropan-1-one,
1-[4-(2-methoxycarbonylethylthio)-phenyl]-2-methyl-2-morpholinopropan-1-one,
1-[4-(dimethylaminomethylthio)-phenyl]-2-morpholinopropan-1-one,
2-methyl-1-[4-(methylsulfinyl)-phenyl]-2-morpholinopropan-1-one,
2-methyl-1-[4-(methylthio)-phenyl]-2-piperidinopropan-1-one,
2-methyl-1-[4-(methylthio)-phenyl]-2-(4-methylpiperazino)-propan-1-one,
2-methyl-1-[4-(methylthio)-phenyl]-2-pyrrolidinopropan-1-one,
2-methyl-1-[4-(methylthio)-phenyl]-2-di(2-methoxyethyl)-amino-propan-1-one,
2-methyl-1-[4-(methylthio)-phenyl]-2-dibutylaminopropan-1-one,
2-methyl-1-[4-(phenylthio)-phenyl]-2-dibutylaminopropan-1-one,
2-methyl-1-[4-(phenylthio)-phenyl]-2-piperidinopropan-1-one,
2-methyl-1-[4-(butylthio)-phenyl]-2-morpholinopropan-1-one,
2-methyl-1-[4-(phenylthio)-phenyl]-2-(4-methylpiperazino)-propan-1-one,
2-methyl-1-[4-(phenylthio)-phenyl]-2-di(2-methoxyethyl)-aminopropan-1-one,
2-methyl-1-[4-(phenylthio)-phenyl]-2-morpholinopropan-1-one,
2-methyl-1-[4-(ethylthio)-phenyl]-2-morpholinopropan-1-one,
2-methyl-1-[4-(octylthio)-phenyl]-2-morpholinopropan-1-one,
2-ethyl-1-[4-(methylthio)-phenyl]-3-morpholinobutan-1-one,
2-methyl-1-[4-(2-(2-mercaptoethoxy)-ethylthio)-phenyl]-2-morpholinopropan-1-one,
2-methyl-1-[4-(octyloxycarbonylmethylthio)-phenyl]-2-morpholinopropan-1-one,
2-methyl-1-(2-thianthrenyl)-2-morpholinopropan-1-one,
1-[4-(methylthio)-benzoyl]-1-morpholinocyclohexane,
2-methyl-1-[4-(methylthio)-phenyl]-2-dimethylaminopropan-1-one,
2-methyl-1-[4-(benzylthio)-phenyl]-2-morpholinopropan-1-one,
2-methyl-1-[4-(4-methylphenylthio)-phenyl]-2-morpholinopropan-1-one,
2-methyl-1-[4-(methylthio)-phenyl]-2-butylaminopropan-1-one,
2-methyl-1-[4-(methylsulfinyl)-phenyl]-2-di(2-methoxyethyl)-aminopropan-1-one,
2-methyl-1-[4-(cyclohexylthio)-phenyl]-2-morpholinopropan-1-one,
2-methyl-1-(4-chlorophenyl)-2-morpholinopropan-1-one,
2-methyl-1-(4-morpholinophenyl)-2-morpholinopropan-1-one,
2-methyl-1-phenyl-2-morpholinopropan-1-one,
2-methyl-1-phenyl-2-dimethylaminopropan-1-one,
2-methyl-1-phenyl-2-diethylaminopropan-1-one,
2-methyl-1-phenyl-2-piperazinopropan-1-one,
2-benzoyl-1-dimethylaminocyclohexane,
2-(2-thenoyl)-2-morpholinopropane,
2-methyl-1-(3,4-dimethylphenyl)-2-morpholinopropan-1-one,
2-methyl-1-phenyl-2-piperidinopropan-1-one,
2-methyl-1-(4-chlorophenyl)-2-piperidinopropan-1-one,
2-methyl-1-(4-methylphenyl)-2-piperidinopropan-1-one,
2-methyl-1-(4-methoxyphenyl)-2-piperidinopropan-1-one,
2-methyl-1-(4-phenoxyphenyl)-2-piperidinopropan-1-one,
2-[2-(methoxycarbonyl)ethyl]-1-phenyl-2-dimethylaminopropan-1-one,
2-methyl-1-(4-methoxyphenyl)-2-diethylaminopropan-1-one,
2-methyl-1-phenyl-2-(4-methylpiperazino)-propan-1-one,
2-methyl-1-[4-(dimethylamino)phenyl]-2-dimethylaminopropan-1-one,
2-methyl-1-(4-piperidinophenyl)-2-piperidinopropan-1-one,
2-methyl-1-[4-(4-methylpiperazino)phenyl]-2-(4-methylpiperazino)-propan-1-one,
bis-4,4'-(α-morpholinoisobutyroyl)-benzophenone, 2-methyl-1-(4-methoxyphenyl)-2-morpholinopropan-1-one,
2-methyl-1-(4-phenoxyphenyl)-2-morpholinopropan-1-one,
2-methyl-1-(3,4-dimethoxyphenyl)-2-isopropylaminopropan-1-one,
1-(4-methoxybenzoyl)-1-methylaminocyclopentane,
3-(4-anisoyl)-3-methyl-1,2,3,4-tetrahydroisoquinoline,
3-(4-anisoyl)-3-benzyl-1,2,3,4-tetrahydroisoquinoline,
3-(3,4-dimethoxybenzoyl)-3-methyl-1,2,3,4-tetrahydroisoquinoline,
2-methyl-1-[4-(2,3-epoxypropyloxy)phenyl]-2-morpholinopropan-1-one,
2-methyl-1-[4-(2-hydroxyethoxy)phenyl]-2-morpholinopropan-1-one,
2-methyl-1-(4-methoxyphenyl)-2-di(2-methoxyethyl)aminopropan-1-one,
2-methyl-1-(4-methoxyphenyl)-2-pyrrolidinopropan-1-one,
2-methyl-1-(4-methoxyphenyl)-2-(4-methylpiperazino)-propan-1-one,
2-methyl-1-(4-methoxyphenyl)-2-dimethylaminopropan-1-one,
2-methyl-1-(4-methoxyphenyl)-2-dibutylaminopropan-1-one,
2-methyl-1-(4-methoxyphenyl)-2-methylphenylaminopropan-1-one,
2-methyl-1-(4-methoxyphenyl)-2-oxazolidinopropan-1-one,
1-(1,3-benzodioxol-5-yl)-2-methyl-2-morpholinopropan-1-one,
1-(1,3-benzodioxol-5-yl)-2-methyl-2-di(2-methoxyethyl)aminopropan-1-one,
2-ethyl-1-(4-methoxyphenyl)-2-morpholinohexan-1-one,
1-(1,3-benzodioxol-5-yl)-2-methyl-2-pyrrolidinopropan-1-one,
1-(1,3-benzodioxol-5-yl)-2-ethyl-2-pyrrolidinobutan-1-one,
1-(1,3-benzodioxol-5-yl)-2-methyl-2-pyrrolidinopentan-1-one,
2-methyl-1-(3,4-dimethoxyphenyl)-2-morpholinopropan-1-one,
2-methyl-1-(3,4,5-trimethoxyphenyl)-2-morpholinopropan-1-one,
1-(dibenzofuran-2-yl)-2-methyl-2-morpholinopropan-1-one,
4-(2-morpholino-2-methylpropanoyl)-benzophenone,
4-[2-di(2-methoxyethyl)-amino-2-methylpropanoyl]-benzophenone,
4-(2-piperidino-2-methylpropanoyl)-benzophenone,
4-[2-(4-methylpiperazino)-2-methylpropanoyl)]-benzophenone,
4-(2-dimethylamino-2-methylpropanoyl)-benzophenone,
4-(2-morpholino-2-methylpropanoyl)-4'-morpholinobenzophenone,
4-(2-piperidino-2-methylpropanoyl)-4'-piperidinobenzophenone,
4-(2-dimethylamino-2-methylpropanoyl)-4'-dimethylaminobenzophenone,
4-[2-(4-methylpiperazino)-2-methylpropanoyl]-4'-(4-methylpiperazino)-benzophenone,
2-(2-morpholino-2-methylpropanoyl)-fluorenone,
2-(2-piperidino-2-methylpropanoyl)-fluorenone,
2-(2-dimethylamino-2-methylpropanoyl)-fluorenone,
2,7-bis-(2-morpholino-2-methylpropanoyl)-fluorenone,
2-(2-morpholino-2-methylpropanoyl)-xanthone,
2-(2-morpholino-2-methylpropanoyl)-acridanone,
2-(2-morpholino-2-methylpropanoyl)-N-methylacridanone,
2-(2-morpholino-2-methylpropanoyl)-dibenzosuberone,
2-(2-piperidino-2-methylpropanoyl)-dibenzosuberone,
2,7-bis-(2-morpholino-2-methylpropanoyl)-dibenzosuberone,
2-(2-morpholino-2-methylpropanoyl)-thioxanthone,
2-(2-morpholino-2-methylpropanoyl)-anthraquinone,
2,7-bis-(2-morpholino-2-methylpropanoyl)-anthraquinone,
2-(2-piperidino-2-methylpropanoyl)-anthraquinone,
2-methyl-1-(4-methylphenyl)-2-morpholinopropan-1-one,
1-(4-methoxybenzoyl)-1-morpholinocyclohexane,
2-methyl-1-[3,4-di(methylthio)phenyl]-2-morpholinopropan-1-one,
2-methyl-1-[3-(2-hydroxyethylthio)-4-methoxyphenyl]-2-morpholinopropan-1-one,
2-methyl-1-(N-methylcarbazol-3-yl)-2-morpholinopropan-1-one,
2-methyl-1-(N-methylphenothiazin-2-yl)-2-morpholinopropan-1-one,
2-methyl-1-(N-methylphenoxazin-2-yl)-2-morpholinopropan-1-one,
2-methyl-1-(phenoxathiin-3-yl)-2-morpholinopropan-1-one,
2-methyl-1-(xanthen-2-yl)-2-morpholinopropan-1-one,
2-methyl-1-(chroman-6-yl)-2-morpholinopropan-1-one,
2-methyl-1-(N-methylindolin-5-yl)-2-morpholinopropan-1-one,
2-methyl-1-(indan-5-yl)-2-morpholinopropan-1-one,
2-methyl-1-(5,6,7,8-tetrahydro-2-naphthyl)-2-morpholinopropan-1-one,
2-methyl-1-[5,10-bis(2-hydroxyethyl)-5,10-dihydrophenazin-2-yl]-2-morpholinopropan-1-one,
2-methyl-1-[1,4-bis(2-hydroxyethyl)-1,2,3,4-tetrahydroquinoxalin-6-yl]-2-morpholinopropan-1-one,
2-methyl-1-[2,3-dihydro-2,3-dimethylbenzothiazol-5-yl]-2-morpholinopropan-1-one,
2-methyl-1-(4-hydroxyphenyl)-2-morpholinopropan-1-one,
2-methyl-1-(4-isopropyloxyphenyl)-2-[N-methyl-N-(2-hydroxyethyl)-amino]-propan-1-one,
1-(4-acryloxybenzoyl)-1-morpholinocyclohexane,
2-methyl-1-[3-methyl-4-(trimethylsilyloxy)-phenyl]-2-morpholinopropan-1-one,
1-(2,3-dihydro-2-methylbenzofuran-5-yl)-methyl-2-morpholinopropan-1-one,
2-ethyl-1-[4-methoxy-3-(2-hydroxyethylthio)-phenyl]-2-morpholinopropan-1-one,
2-methyl-1-(4-ethoxy-3-methylphenyl)-2-[N-(2-hydroxyethyl)-N-(2-methoxyethyl)-amino]-propan-1-one,
2-methyl-1-(4-cumyl)-2-morpholinobutan-1-one,
[5,10-di(2-hydroxyethyl)-5,10-dihydrophenazin-3-yl](1-morpholinocyclohexyl)-ketone,
1-(1,4-dimethyl-1,2,3,4-tetrahydroquinoxalin-6-yl)-2-methyl-2-morpholinopropan-1-one,
2-methyl-1-(1,4-dimethyl-1,2,3,4-tetrahydroquinoxalin-6-yl)-2-morpholinopropan-1-one,
2-methyl-1-[5,10-bis(2-hydroxyethyl)-5,10-dihydrophenazin-2-yl]-2-morpholinopropan-1-one,
2,8-bis($\alpha$-morpholinoisobutyroyl)-5,10-bis(2-hydroxypropyl)-5,10-dihydrophenazine,
2-methyl-1-(10-methyl-10-H-phenoxazin-2-yl)-2-morpholinopropan-1-one,
2-methyl-1-(10-methyl-10-H-phenothiazin-3-yl)-2-morpholinopropan-1-one, Examples of individual compounds of the formula II are:

N,N'-bis(α-benzoylisopropyl)-piperazine,
N,N'-bis[α-(4-methylthiobenzoyl)-isopropyl]-piperazine,
bis-[α-(4-isopropylbenzoyl)-isopropyl]-amine,
N,N'-bis(α-benzoylisopropyl)-hexamethylenediamine,
N,N'-bis-[α-(4-morpholinobenzoyl)isopropyl]hexamethylenediamine,
N,N'-dimethyl-N,N'-bis-[α-(4-dimethylaminobenzoyl)isopropyl]-hexamethylenediamine,
N,N'-bis-[α-(4-(2-hydroxyethylthio)benzoyl)isopropyl]-piperazine,
N,N'-bis-[α-methyl-α-(4-methoxybenzoyl)propyl]-piperazine,
N,N'-bis-[α-(4-(methylthio)benzoyl)isopropyl]methylamine,
N,N'-bis-[α-(4-methoxybenzoyl)isopropyl]-N-(2-hydroxyethyl)amine,
N,N'-bis-[α-(4-(methylthio)benzoyl)isopropyl]hexamethylenediamine and
N,N'-dimethyl-N,N'-bis-[α-(4-methoxybenzoyl)isopropyl]hexamethylenediamine.

In certain cases it can be advantageous to use a mixture of 2 or more photoinitiators of the formula I or II or a mixture with a known photoinitiator which is not of the formula I or II.

The photoinitiators of the formulae I and II are in some cases compounds whose preparation, properties and use have been described in European Patent A-3,002. Where the compounds are new they can be prepared analogously to the known compounds.

Examples of new compounds are those compounds of the formula I or II in which Ar is a phenyl, biphenylyl or benzoylphenyl group substituted by at least one $-N(R^7)(R^8)$ radical. These compounds thus each contain at least one amino group in both the aliphatic portion and the aromatic portion of the molecule. These amino groups can be identical or different. In preferred compounds, Ar is a $-N(R^7)(R^8)$-substituted phenyl, alkylphenyl or halogenophenyl, but in particular phenyl where this substituent is preferably in the 4-position.

Examples of individual aminoaryl ketones of this type are 2-methyl-1-(4-morpholinophenyl)-2-morpholinopropan-1-one,
2-methyl-1-[4-(4-methylpiperazino)phenyl]-2-(4-methylpiperazino)-propan-1-one,
2-methyl-1-[4-(di(2-methoxyethyl)amino)phenyl]-2-di(2-methoxyethyl)-aminopropan-1-one,
2-methyl-1-[4-(dimethylamino)phenyl]-2-dimethylaminopropan-1-one,
2-methyl-1-[4-(dimethylamino)phenyl]-2-morpholinopropan-1-one,
2-methyl-1-(4-piperidinophenyl)-2-morpholinopropan-1-one,
2-methyl-1-[4-(diethylamino)phenyl]-2-morpholinopropan-1-one,
2-methyl-1-(4-morpholinophenyl)-2-morpholinobutan-1-one,
2-methyl-1-[4-(di(2-methoxyethyl)amino)phenyl]-2-morpholinopropan-1-one,
2-methyl-1-(4-morpholinophenyl)-2-di(2-methoxyethyl)aminopropan-1-one,
2-methyl-1-(4-morpholinophenyl)-2-morpholinopentan-1-one,
2-ethyl-1-(4-morpholinophenyl)-2-morpholinohexan-1-one,
1-[4-(morpholino)benzoyl]-1-morpholinocyclohexane,
1-[4-(dimethylamino)benzoyl]-1-morpholinocyclohexane,
1-[4-(dimethylamino)benzoyl]-1-morpholinocyclopentane,
2-ethyl-1-(4-morpholinophenyl)-2-morpholinobutan-1-one,
2-propyl-1-(4-dimethylaminophenyl)-2-morpholinopentan-1-one,
2-methyl-1-(4-dimethylaminophenyl)-2-morpholinobutan-1-one,
2-ethyl-1-(4-dimethylaminophenyl)-2-morpholinohexan-1-one,
2-methyl-1-(4-piperazinophenyl)-2-piperazinopropan-1-one,
2-methyl-1-(4-dimethylaminophenyl)-2-piperidinopropan-1-one,
2-methyl-1-(4-diethylaminophenyl)-2-diethylaminopropan-1-one,
2-methyl-1-(4-methylpropylaminophenyl)-2-methylpropylaminopropan-1-one,
2-methyl-1-[4-(N-(2-hydroxyethyl)piperazino)phenyl]-2-[N-(2-hydroxyethyl)piperazino]-propan-1-one,
2-methyl-1-[4-(2,6-dimethylmorpholino)phenyl]-2-(2,6-dimethylmorpholino)-propan-1-one,
2-methyl-1-(4-dimethylaminophenyl)-2-(2,6-dimethylmorpholino)-propan-1-one,
2-methyl-1-(4-dimethylaminophenyl)-2-(4-methylpiperazino)-propan-1-one,
2-methyl-1-(4-dimethylaminophenyl)-2-piperazinopropan-1-one,
2-methyl-1-(4-dimethylaminophenyl)-2-di(2-methoxyethyl)-aminopropan-1-one,
2-methyl-1-(4-pyrrolidinophenyl)-2-pyrrolidinopropan-1-one,
2-methyl-1-[3,4-bis(dimethylamino)phenyl]-2-morpholinopropan-1-one,
2-methyl-1-(3-dimethylaminophenyl)-2-morpholinopropan-1-one,
2-methyl-1-(3-bromo-4-dimethylaminophenyl)-2-morpholinopropan-1-one,
2-methyl-1-(4-dimethylamino-3-methylphenyl)-2-morpholinopropan-1-one,
2-methyl-1-(3-dimethylamino-4-methoxyphenyl)-2-morpholinopropan-1-one,
2-methyl-1-(3-morpholino-4-methoxyphenyl)-2-morpholinopropan-1-one,
2-methyl-1-[3-dimethylamino-4-(methylthio)-phenyl]-2-morpholinopropan-1-one,
2-methyl-1-[4-morpholino-3-(methylthio)-phenyl]-2-morpholinobutan-1-one,
N-methyl-4,4'-bis(α-morpholinoisobutyroyl)-diphenylamine,
N-(2-hydroxyethyl)-4,4'-bis(α-morpholinoisobutyroyl)-diphenylamine,
N,N'-bis-[α-(4-morpholinobenzoyl)isopropyl]-piperazine,
N,N'-bis-[α-(methyl-α-(4-dimethylaminobenzoyl)propyl]-piperazine,
N,N-bis-[α-(4-dimethylaminobenzoyl)isopropyl]methylamine,
N,N-bis-[α-(4-morpholinobenzoyl)isopropyl]benzylamine,
2-methyl-1-(4-dimethylaminophenyl)-2-dimethylaminobutan-1-one,
2-methyl-1-(4-dimethylaminophenyl)-2-dimethylaminopentan-1-one,
2-ethyl-1-(4-dimethylaminophenyl)-2-dimethylaminohexan-1-one, 1-[4-(dimethylamino)benzoyl]-1-dimethylaminocyclohexane, 2-methyl-1-(3-bromo-4-di-methylaminophenyl)-2-dimethylaminopropan-1-one, 2-methyl-1-[3,4-bis(dimethylamino)-phenyl]-2-dimethylaminopropan-1-one, 2-methyl-1-(3-dimethylamino-4-morpholinophenyl)-2-dimethylaminopropan-1-one, 2-methyl-1-(4-methylaminophenyl)-2-dimethylaminopropan-1-one, 2-methyl-1-(4-methylaminophenyl)-2-morpholinopropan-1-one, 2-methyl-1-(4-methylaminophenyl)-2-methylaminopropan-1-one, 2-methyl-1-(4-aminophenyl)-2-dimethylaminopropan-1-one, 2-methyl-1-(4-aminophenyl)-2-morpholinopropan-1-one, 2-methyl-1-(4-acetylaminophenyl)-2-dimethylaminopropan-1-one, 2-methyl-1-(4-acrylamidophenyl)-2-morpholinopropan-1-one, 2-methyl-1-[4-(N-(2-hydroxyethyl)-N-methylamino)-phenyl]-2-dimethylaminopropan-1-one, 2-methyl-1-(4-dimethylaminophenyl)-2-methylaminopropan-1-one, 2-methyl-1-(4-dimethylaminophenyl)-2-allylaminopropan-1-one, 2-methyl-1-(4-diallylaminophenyl)-2-diallylaminopropan-1-one, 2-methyl-1-[4-(N-ethyl-N-methylamino)phenyl]-2-(N-ethyl-N-methylamino)-propan-1-one and 2-methyl-1-(4-dimethylaminophenyl)-2-anilinopropan-1-one.

In the preparation of these compounds, the $-N(R^7)(R^8)$ amino group can be introduced by reacting the corresponding halogenoaryl or nitroaryl ketone with an $(R^7)(R^8)NH$ ketone. In particular 4-fluorophenyl and 4-chlorophenyl ketones are particularly suitable for this reaction. The aliphatic amino group $-N(R^3)(R^4)$ can be introduced, by conventional methods, before or after the introduction of $-N(R^7)(R^8)$. If $-N(R^3)(R^4)$ is identical to $-N(R^7)(R^8)$, the two amino groups can be introduced in one step. These process variants are described in more detail in the following preparation examples.

PREPARATION EXAMPLES

2-(4-Fluorophenyl)-3,3-dimethyl-2-methoxyoxirane 39.22 g (0.16 mol) of 2-bromo-1-(4-fluorophenyl)-2-methylpropan-1-one, prepared by brominating 1-(4-fluorophenyl)-2-methylpropan-1-one analogously to European Patent Application No. 3,002, are dissolved in 50 ml of methanol. 23.5 g (0.176 mol) of methanolic 30% strength sodium methylate solution are added dropwise at room temperature. The methanol is then distilled off, and the residue is taken up with diethyl ether. The salt is filtered off, and the ether solution is concentrated. The liquid crude product is further reacted as described hereinafter without further purification.

1-(4-Fluorophenyl)-2-methyl-2-morpholinopropan-1-one 29.43 g (0.15 mol) of 2-(4-fluorophenyl)-3,3-dimethyl-2-methoxyoxirane and 52.3 g (0.60 mol) of morpholine are brought together, and the mixture is heated to reflux temperature (about 130° C.). After 23 hours the excess morpholine is distilled off. The residue is taken up with toluene, and the mixture is extracted with dilute hydrochloric acid. The hydrochloric acid solution is rendered alkaline and is extracted with toluene. The toluene solution is dried with $K_2CO_3$ and is concentrated. The residue, 34.0 g, crystallises out from ethyl acetate with a melting point of 63°–66° C.

$C_{14}H_{18}FNO_2$ (251.30) calculated C 66.91%, H 7.22%, N 5.57%; found C 66.86%, H 7.18%, N 5.62%.

2-Methyl-1-(4-morpholinophenyl)-2-morpholinopropan-1-one 15.08 g (0.06 mol) of 1-(4-fluorophenyl)-2-methyl-2-morpholinopropan-1-one and 5.23 g (0,06 mol) of morpholine are dissolved in 25 ml of dimethyl sulfoxide, and the solution is heated to 160° C. together with 8.3 g (0.06 mol) of potassium carbonate. After 18 hours of stirring at about 160° C. the suspension is cooled down and is poured onto an ice-water mixture. The crystals are filtered off, are washed with water and are recrystallised from ethanol. Melting point 114°–116° C.

$C_{18}H_{26}N_2O_3$ (318.42) calculated: C 67.90%, H 8.23%, N 8.80%, O 15.07%; found: C 67.89%, H 8.04%, N 8.82%, O 15.16%.

The structure is confirmed by the $^1$H-NMR spectrum.

1-(4-Fluorophenyl)-2-methyl-2-(4-methylpiperazino)-propan-1-one 29.43 g (0.15 mol) of 2-(4-fluorophenyl)-3,3-dimethyl-2-methoxyoxirane and 60.1 g (0.60 mol) of 1-methylpiperazine are brought together, and the mixture is heated to about 125° C. After 8 hours it is cooled down and the excess 1-methylpiperazine is distilled off. The residue is taken up in toluene, and the mixture is extracted with dilute hydrochloric acid. The hydrochloric acid solution is rendered alkaline and is extracted with toluene. The toluene solution is dried with $K_2CO_3$ and concentrated. The residue, 29.4 g of a cognac-coloured oil, is then further reacted.

2-Methyl-1-[4-(4-methylpiperazino)phenyl]-2-(4-methylpiperazino)-propan-1-one 13.2 g (0.05 mol) of 1-(4-fluorophenyl)-2-methyl-2-(4-methylpiperazino)-propan-1-one and 6.5 g (0.065 mol) of 1-methylpiperazine are dissolved in 20 ml of dimethyl sulfoxide, and the solution is heated to about 115° C. together with 6.9 g (0.05 mol) of potassium carbonate. After 15 hours of stirring at about 115° C. the suspension is cooled down and is poured at about 60° C. onto ice. The crystals are filtered off and are recrystallised twice from ethyl acetate. Melting point 133°–136° C.

$C_{20}H_{32}N_4O$ (344.50) calculated: C 69.73%, H 9.36%, N 16.26%; found: C 59.58%, H 9.34%, N 16.24%.

The structure is confirmed by the $^1$H-NMR spectrum.

Corresponding 2-(4-fluorophenyl)-3,3-dialkyl-2-methoxyoxiranes are analogously subjected to two-stage amine conversion to give the following compounds:

2-Methyl-1-(4-morpholinophenyl)-2-di(2-methoxyethyl)-aminopropan-1-one, viscous oil $C_{20}H_{32}N_2O_4$ (364.49). calculated: C 65.90, H 8.85, N 7.68%; found: C 65.00, H 8.95, N 7.16%.

2-Methyl-1-(4-morpholinophenyl)-2-morpholinobutan-1-one

Melting point 111°–114° C. (ethanol). $C_{19}H_{28}N_2O_3$ (332.45). calculated: C 68.63, H 8.49, N 8.42%; found: C 68.83, H 8.43, N 8.39%.

2-Methyl-1-(4-dimethylaminophenyl)-2-morpholinopropan-1-one

Melting point 152°–155° C. (ethanol). $C_{16}H_{24}N_2O_2$ (276.38). calculated: C 69.53, H 8.75, N 10.14%; found: C 69.54, H 8.70, N 10.17%.

2-Methyl-1-(4-diethylaminophenyl)-2-morpholinopropan-1-one

Melting point 86°–89° C. (isopropanol). $C_{18}H_{28}N_2O_2$ (304.44). calculated: C 71.02, H 9.27, N 9.20%; found: C 70.57, H 9.16, N 9.08%.

The structures are confirmed by the $^1$H-NMR spectra.

1-[4-(Dimethylamino)phenyl]-2-dimethylamino-2-methylpropan-1-one 29.4 g (0.15 mol) of 2-(4-fluorophenyl)-3,3-dimethyl-2-methoxyoxirane and 50 ml of toluene are placed into an empty high-pressure apparatus. 27 g (0.60 mol) of dimethylamine gas are then injected. The mixture is held at 130° C. (maximum pressure 39 bar). The end point of the reaction is determined by gas chromatography. The solution is concentrated, and the yellow crystals are dissolved in toluene. The solution is extracted with dilute hydrochloric acid. The hydrochloric acid solution has toluene added to it and is rendered alkaline. The toluene phase is separated off, is dried with $K_2CO_3$ and is concentrated in a rotary evaporator. The residue is recrystallised from isopropanol. Melting point 89°–91° C.

$C_{14}H_{22}N_2O$ (234.34). calculated: C 71.76, H 9.46, N 11.95%; found: C 71.6, H 9.56, N 11.99%.

2-Methyl-1-(4-piperidinophenyl)-propan-1-one 49.86 (0.30 mol) of 1-(4-fluorophenyl)-2-methylpropan-1-one, prepared by a Friedel-Crafts reaction from isobutyryl chloride with fluorobenzene analogously to European Patent Application No. 3,002, and 25.5 g (0.30 mol) of piperidine are dissolved in 120 ml of dimethyl sulfoxide, and the solution is heated to 110° C. together with 41.5 g (0.30 mol) of potassium carbonate. After 16 hours of stirring at 110° C. the suspension is cooled down and is poured onto an ice-water mixture. The crystals are filtered off, are washed with water and are recrystallised from hexane.

$C_{15}H_{21}NO$ (231.34) Melting point 57°–60° C. calculated: C 77.87%, H 9.14%, N 6.05%; found: C 77.59%, H 9.26%, N 5,96%.

2-Bromo-2-methyl-1-(4-piperidinophenyl)-propan-1-one 34.70 g (0.15 mol) of 2-methyl-1-(4-piperidinophenyl)-propan-1-one are dissolved in 200 ml of glacial acetic acid. 0.58 g (5.0 mmol) of chlorosulfonic acid (corresponding to 0.33 ml) are added as catalyst. 24.0 g (0.15 mol) of bromine are then added dropwise at room temperature with thorough stirring in the course of approximately one hour. The solution is then poured onto ice and is brought to about pH 6 with dilute sodium hydroxide solution. The precipitated crystals are extracted with toluene. The toluene solution is dried with $Na_2SO_4$ and is concentrated at 40° C. under the vacuum of a rotary evaporator. The slowly crystallising, orange liquid is then reacted further.

3,3-Dimethyl-2-methoxy-2-(4-piperidinophenyl)-oxirane 12.0 g (38.7 mmol) of 2-bromo-2-methyl-1-(4-piperidinophenyl)-propan-1-one are dissolved in 20 ml of methanol, and 7.0 g (46.4 mmol) of methanolic 30% strength sodium methylate solution are then added dropwise at room temperature. The methanol is then distilled off under reduced pressure. The residue is taken up in toluene, and the precipitated salt is filtered off. The solution is concentrated in vacuo. The brown residue, which is a slowly crystallising liquid, is directly further reacted.

2-Methyl-2-morpholino-1-(4-piperidinophenyl)-propan-1-one 12.1 g (46.3 mmol) of 3,3-dimethyl-2-methoxy-2-(4-piperidinophenyl)-oxirane and 26.1 g (0.30 mol) of morpholine are added together, and the mixture is heated to the refluxing temperature (about 130° C.). After 6 hours the mixture is cooled down and the morpholine is distilled off under reduced pressure. The residue is taken up in toluene and is extracted with dilute hydrochloric acid. The hydrochloric acid solution is rendered alkaline and is extracted with toluene. The toluene solution is dried with $K_2CO_3$ and concentrated. The residue is recrystallised from methanol. Melting point 159°–162° C.

$C_{19}H_{28}N_2O_2$ (316.45). calculated: C 72.11%, H 8.91%, N 8.85%; found C 72.12%, H 8.96%, N 8.82%.

The structure is confirmed by the $^1$H-NMR spectrum.

The amount of photoinitiator of formula I or II in the photopolymerisable mixture is about 0.2 to 20% by weight, preferably 1–6% by weight.

It can be advantageous to use the photoinitiators of the formula I or II in photopolymerisable aqueous dispersions or emulsions in the form of their salts with organic or inorganic acids. These salts are distinctly more soluble in water and are more easily incorporated into the aqueous systems.

Component (C) in the mixture is a photosensitiser from the group of aromatic carbonyl compounds having a triplet energy of 225–310 kJ/mol.

Examples of these classes of compounds are xanthones, thioxanthones, phthalimides, anthraquinones, acetophenones, propiophenones, benzophenones, acylnaphthalenes, 2-(acylmethylene)-thiazolines, 3-acylcoumarins and 3,3'-carbonylbiscoumarins.

Preferred sensitisers are thioxanthones, 3-acylcoumarins and 2-(aroylmethylene)-thiazolines, but in particular thioxanthones and 3-aroylcoumarins.

Examples of individual compounds which can be used as photosensitisers according to the invention are:
xanthone,
thioxanthone,
2-isopropylthioxanthone,
2-chlorothioxanthone,
2-dodecylthioxanthone,
1-methoxycarbonylthioxanthone,
2-ethoxycarbonylthioxanthone,
3-(2-methoxyethoxycarbonyl)-thioxanthone,
4-butoxycarbonylthioxanthone,
3-butoxycarbonyl-7-methylthioxanthone,
1-cyano-3-chlorothioxanthone, 1-ethoxycarbonyl-3-chlorothioxanthone,
1-ethoxycarbonyl-3-ethoxythioxanthone,
1-ethoxycarbonyl-3-aminothioxanthone,
1-ethoxycarbonyl-3-phenylsulfurylthioxanthone,
3,4-di-2-(2-methoxyethoxy)ethoxycarbonyl-thioxanthone,
1-ethoxycarbonyl-3-(1-methyl-1-morpholinoethyl)-thioxanthone,
2-methyl-6-dimethoxymethylthioxanthone,
2-methyl-6-(1,1-dimethoxybenzyl)-thioxanthone,
2-morpholinomethylthioxanthone,
2-methyl-6-morpholinomethylthioxanthone,
N-allylthioxanthone-3,4-dicarboximide,
N-octylthioxanthone,3,4-dicarboximide
N-(1,1,3,3-tetramethylbutyl)-thioxanthone-3,4-dicarboximide,
6-ethoxycarbonyl-2-methoxythioxanthone,
6-ethoxycarbonyl-2-methylthioxanthone,
polyethylene glycol thioxanthone-2-carboxylate,
3-phenylthiophthalimide,
N-methyl-3,5-di(ethylthio)-phthalimide,
3-benzoylcoumarin,
3-benzoyl-7-methoxycoumarin,
3-benzoyl-5,7-di(propoxy)-coumarin,
3-benzoyl-6,8-dichlorocoumarin,
3-benzoyl-6-chlorocoumarin,
3,3'-carbonyl-bis[5,7-di(propoxy)-coumarin],
3,3'-carbonyl-bis(6,8-dichlorocoumarin),
3-isobutyroyl-coumarin,
3-benzoyl-5,7-dimethoxycoumarin,
3-benzoyl-5,7-diethoxycoumarin,
3-benzoyl-5,7-dibutoxycoumarin,
3-benzoyl-5,7-di(methoxyethoxy)coumarin,
3-benzoyl-5,7-di(allyloxy)coumarin,
acetophenone,
3-methoxyacetophenone,
4-phenylacetophenone,
benzaldehyde,
benzophenone,
4-phenylbenzophenone,
4-methoxybenzophenone,
4,4'-dimethoxybenzophenone,
4,4'-dimethylbenzophenone,
4-methylbenzophenone,
4-(2-hydroxyethylthio)-benzophenone,
4-(4-tolylthio)-benzophenone,
2-acetylnaphthalene,
2-naphthaldehyde,
3-methyl-2-benzoylmethylene-β-naphthothiozoline,
3-methyl-2-benzoylmethylenebenzothiazoline and
3-ethyl-2-propionylmethylene-β-naphthothiazoline.

Particular preference is given to thioxanthones and 3-acylcoumarins having a triplet energy of 225-276 kJ/mol.

The amount of photosensitiser in the photopolymerisable mixture is about 0.01 to 5% by weight, preferably 0.025 to 2% by weight.

These component (C) sensitisers increase the activity of photoinitiators (B) without shortening the shelf life of the mixtures. The increased activity is particularly marked in pigment systems, such as printing inks or white enamels. The mixtures have the special advantage that appropriate choice of a photosensitiser C allows the spectral sensitivity of photoinitiator B to be shifted into any desired wavelength regions. Previously such a shift in the spectral sensitivity of photoininiators could only be obtained by technically complicated and costly synthetic modification of the photoinitiator. The fact that there are a large number of photosensitisers available thus allows the desired effect to be obtained by preparing the mixtures according to the invention without the problem of technically complicated synthesis. Many of these sensitisers moreover have the advantage that they can be excited with visible light.

The photocurable mixtures can be used for various purposes. Of primary importance is their use in pigmented or colorant-containing systems, for example printing inks, in photographic reproduction and image-recording processes, and for preparing relief formes.

A further important field of use is in paints, which can be pigmented or non-pigmented. The mixtures are particularly useful in white enamels, meaning $TiO_2$-pigmented paints. Other fields of use are the radiation curing of photoresists, the photocrosslinking of silver-free films and the preparation of printing plates Photocuring microcapsules and image-recording or photocopying systems prepared therefrom are another interesting use. Systems of this type are described in for example German Offenlegungsschrift 3,226,608. The advantage of the present mixtures is that the spectral sensitivity of the photocuring microcapsules is infinitely variable. It is consequently easily possible, for example, to prepare even copying systems for colour-photocopies by using microcapsules which are cured at 3 different wavelengths (corresponding to the 3 complementary colours of visible light).

Depending on their intended use the photopolymerisable mixtures can contain further additives, for example pigments, dyes and their precursors, fillers, solvents, flow-control agents, thixotropic agents or wetting agents. Other possible additives are stabilisers, for example photostabilisers, UV absorbers, antioxidants, polymerisation inhibitors, corrosion inhibitors or free-radical polymerisation initiators.

The photopolymerisable mixtures are applied to the substrate in the form of thin films by the customary techniques for this purpose, for example spraying, brushing or dipping. In certain cases the mixture can be processed via the melt into photocurable films which can be applied to any substrate. The film is subsequently cured by irradiation with light, preferably UV light of the wavelength range 250–500 mm. Examples of suitable light sources for this purpose are mercury medium pressure, high pressure and low pressure projectors, superactinic fluorescent tubes and metal halide lamps. The radiation curing is preferably carried out in a continuous method where the material to be cured is carried along underneath the radiation source. The transport speed is critical for the production speed of the article; it depends on the required radiation time. The speeded-up radiation curing permitted by the photoinitiators is therefore an important factor in the production of such articles, and it is one of the advantages of the combination of (B) and (C) that even in low concentrations in materials of high pigment content they ensure rapid curing. In the preparation of relief forms or graphical reproduction or image-recording processes the exposure to light is followed by a developing process.

The following examples illustrate the invention in more detail without limiting it thereto.

Example 1

A white enamel is prepared according to the following recipe:

17.6 g of Ebecryl ® 593 (polyester-acrylate resin from UCB, Belgium), 11.8 g of N-vinylpyrrolidone,
19.6 g of RTC-2 titanium dioxide (titanium dioxide from Tioxide, Great Britain),
19.6 g of Sachtolith® HDS (lithopons from Sachtleben Chemie, West Germany),
11.8 g of trimeth propane trisacrylate,
19.6 g of Setalux® UV 2276 (acrylated epoxy resin based on bisphenol A, from Synthetic Resin Makers Synthese, Netherlands).

The above components are ground to a maximum particle size of 5 μm with 125 g of glass beads (diameter 4 cm) in a 250 ml glass flask in the course of at least 24 hours.

The stock paste thus obtained is divided into portions, and each portion is mixed at 60° C. with the photoinitiators and photosensitisers (co-initiators) given in Table 1 by stirring, and the mixtures are ground once more for 16 hours with glass beads.

The white enamels thus prepared are applied to glass plates by knife-coating in a thickness of 30 μm. The samples are exposed to the light from an 80 W/cm lamp in one pass through a PPG irradiator. The speed at which the samples pass through the irradiator is continuously raised by the equipment until the curing is no longer adequate. The maximum speed at which a smudgeproof film is still formed is referred to in Table 1 as the "curing speed".

The following compounds are used in this Example:
PI  1 = 1-(4-methylthiophenyl)-2-methyl-2-morpholinopropan-1-one
PI 2 = 1-phenyl-2-methyl-2-morpholinopropan-1-one
PI  3 = 1-(4-chlorophenyl)-2-methyl-2-morpholinopropan-1-one
PI  4 = 1-(4-toluyl)-2-methyl-2-morpholinopropan-1-one
PS 1 = 2-methyl-6-ethoxycarbonylthioxanthone
PS 2 = compound of the formula

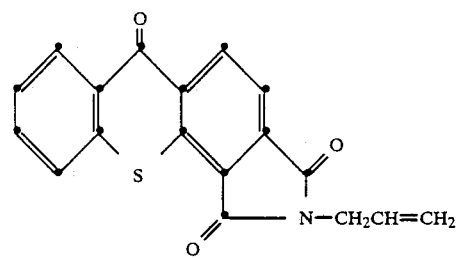

PS 3 = compound of the formula

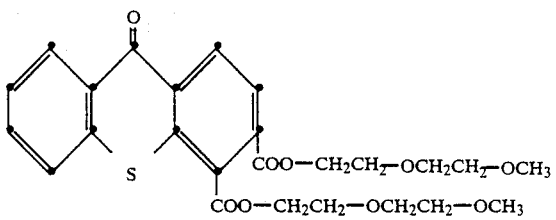

PS 4 = 2-methoxy-6-ethoxycarbonyl-thioxanthone

TABLE 1

| Photoinitiator | Co-Initiator (Sensitiser) | Curing speed |
| --- | --- | --- |
| 2% PI 1 | — | 10 m/min |
| — | 0.5% PS 1 | 10 m/min |
| 2% PI 1 | 0.25% PS 1 | 70 m/min |

TABLE 1-continued

| Photoinitiator | Co-Initiator (Sensitiser) | Curing speed |
| --- | --- | --- |
| 2% PI 1 | 0.25% PS 2 | 90 m/min |
| 2% PI 1 | 0.25% PS 3 | 60 m/min |
| 2% PI 1 | 0.25% PS 4 | 70 m/min |
| 2% PI 2 | 0.25% PS 1 | 30 m/min |
| 2% PI 3 | 0.25% PS 1 | 40 m/min |
| 2% PI 4 | 0.25% PS 1 | 60 m/min |

It is apparent from the Table that even small amounts of sensitiser have a marked accelerating effect on the curing speed.

Example 2

Example 1 is repeated, except that the samples are cured with a D-lamp in an irradiator from Fusion Systems (USA), the radiation peak of this lamp being at a higher wavelength than that of the UV lamp in the PPG equipment of Example 1.

Present as photoinitiators are 2% of PI 1 (=1-(4-methylthiophenyl)-2-methyl-2-morpholinopropan-1-one) and 2% of PI 5 (=2-methyl-1-(4-morpholinophenyl)-2-morpholinopropan-1-one). The sensitisers used are 0.5% of each of the following:
PS 1 = 2-methyl-6-ethoxycarbonylthioxanthone
PS 5 = 2-isopropylthioxanthone
PS 6 = 1-methyl-2-benzoylmethylene-β-naphthothiazoline

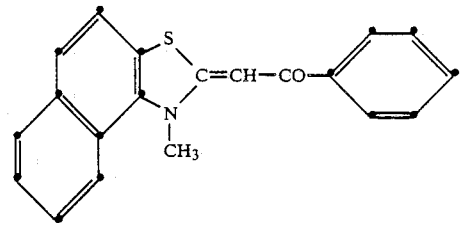

PS 7 = 3-benzoyl-5,7-dipropoxycoumarin

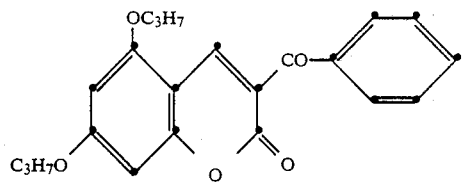

TABLE 2

| Photoinitiator | Co-Initiator (Sensitiser) | Curing speed m/min |
| --- | --- | --- |
| 2% PI 1 | — | 20 |
| 2% PI 1 | 0.5% PS 1 | 70 |
| 2% PI 1 | 0.5% PS 5 | 70 |
| 2% PI 1 | 0.5% PS 6 | 40 |
| 2% PI 1 | 0.5% PS 7 | 50 |
| 2% PI 5 | — | 40 |
| 2% PI 5 | 0.5% PS 1 | >200 |
| 2% PI 5 | 0.5% PS 5 | 80 |
| 2% PI 5 | 0.5% PS 6 | 60 |
| 2% PI 5 | 0.5% PS 7 | >200 |

Example 3

A white enamel is prepared according to the following recipe:

38.5 g of Actylan ® AJ 18 (polyurethane acrylate from SNPE, France)
19.2 g of N-vinylpyrrolidone
38.5 g of RTC-2 titanium dioxide (Tioxide, Great Britain)
3.8 g of butyl acetate As described in Example 1, the individual samples are prepared from this stock paste by admixing the photoinitiators and co-initiators listed in Table 3 and grinding. The samples are applied to glass plates with a 30 μm doctor blade. The samples were cured on the one hand with an 80 W lamp in a PPG irradiator and on the other with a D-lamp in an irradiator from Fusion Systems (USA). The two lamps have different emission spectra.

The following photoinitiators are used:
PI  5 = 2-methyl-1-(4-morpholinophenyl)-2-morpholinopropan-1-one,
PI  6 = 2-methyl-1-[4-(4-methylpiperazino)-phenyl]-2-(4-methylpiperazino)-propan-1-one,
PI  7 = 2-methyl-1-(4-dimethylaminophenyl)-2-dimethylaminopropan-1-one,
PI  8 = 2-methyl-1-(4-piperidinophenyl)-2-morpholinopropan-1-one,
PI  9 = 2-methyl-1-(4-diethylaminophenyl)-2-morpholinopropan-1-one,
PI 10 = 2-methyl-1-(4-morpholinophenyl)-2-di(2-methoxyethyl)-aminopropan-1-one,
PI11 = 2-methyl-1-(4-morpholinophenyl)-2-morpholinobutan-1-one,
PI 12 = 2-methyl-1-(4-diethylaminophenyl)-2-morpholinopropan-1-one The co-initiators (sensitisers) used are:
PS 1 = 2-methyl-6-ethoxycarbonylthioxanthone,
PS 5 = 2-isopropylthioxanthone,
PS 7 = 3-benzoyl-5,7-dipropoxycoumarin

TABLE 3

| Photo-initiator | Sensi-tiser | Curing in PPG machine | | with Fusion D-lamp | |
|---|---|---|---|---|---|
| | | Maximum speed (m/min) | Pendulum hardness (sec) | Maximum speed (m/min) | Pendulum hardness (sec) |
| 2% PI 5 | — | 20 | 40 | 40 | 34 |
| 2% PI 5 | 0.25% PS 1 | 50 | 26 | >200 | 28 |
| 2% PI 5 | 0.25% PS 5 | 40 | 37 | 190 | 43 |
| 2% PI 5 | 0.5% PS 1 | 70 | 31 | >200 | 35 |
| 2% PI 6 | — | 20 | 45 | 50 | 50 |
| 2% PI 6 | 0.5% PS 1 | 30 | 21 | 80 | 20 |
| 2% PI 7 | — | 40 | 42 | 100 | 43 |
| 2% PI 7 | 0.5% PS 1 | 100 | 22 | >200 | 35 |
| 2% PI 8 | — | 20 | 50 | 30 | 52 |
| 2% PI 8 | 0.5% PS 1 | 80 | 31 | >200 | 34 |
| 2% PI 9 | — | 20 | 50 | 30 | 50 |
| 2% PI 9 | 0.5% PS 1 | 70 | 22 | >200 | 31 |
| 2% PI 9 | 0.5% PS 7 | 70 | 30 | >200 | 50 |
| 2% PI 10 | — | 20 | 33 | 80 | 38 |
| 2% PI 10 | 0.5% PS 1 | 100 | 34 | >200 | 40 |
| 2% PI 11 | — | 20 | 43 | 30 | 43 |
| 2% PI 11 | 0.5% PS 1 | 70 | 31 | >200 | 31 |
| 2% PI 11 | — | 20 | 46 | 30 | 51 |
| 2% PI 12 | 0.5% PS 1 | 50 | 42 | >200 | 28 |

Example 4

The recipe of Example 3 is used, except that instead of 38.5 g of TiO$_2$-only 19.3 g of TiO$_2$ and 19.2 g of lithopons (Sachthalit ® HDS) are used. The photoinitiator for all the samples is 2% of PI 1 (= 1-(4-methylthiophenyl)-2-methyl-2-morpholinopropan-1-one).

The sensitisers are 0.1 and 0.25% of PS 1, PS 5 and the following compounds:

PS 8 = 3,4-di(ethoxycarbonyl)-thioxanthone,
PS 9 = 3,4-di(allyloxycarbonyl)-thioxanthone,
PS 10 = N-isopropylthioxanthone-3,4-dicarboximide Curing is effected as in Example 3 both in a PPG machine and under a Fusion D-lamp.

TABLE 4

| Sensitiser | Curing In PPG machine | | with Fusion D-lamp | |
|---|---|---|---|---|
| | Maximum speed (m/min) | Pendulum hardness (sec) | Maximum speed (m/min) | Pendulum hardness (sec) |
| none | 20 | 36 | 40 | 36 |
| 0.1% PS 1 | 50 | 31 | 180 | 24 |
| 0.25% PS 1 | 60 | 36 | >200 | 27 |
| 0.1% PS 5 | 40 | 57 | 170 | 28 |
| 0.25% PS 5 | 50 | 32 | 190 | 32 |
| 0.1% PS 8 | 40 | 26 | 120 | 24 |
| 0.25% PS 8 | 40 | 57 | 120 | 39 |
| 0.1% PS 9 | 40 | 34 | 80 | 33 |
| 0.25% PS 9 | 40 | 31 | 100 | 28 |
| 0.1% PS 10 | 30 | 27 | 70 | 27 |
| 0.25% PS 10 | 30 | 32 | 80 | 31 |

(in each case 2% of PI 1)

Example 5

A blue printing ink is prepared according to the following recipe:
62 parts of Setalin ® AP 565 (urethane acrylate resin from Synthese, Netherlands),
15 parts of 4,4'-di-(β-acryloyloxyethoxy)-2,2-diphenylpropane (Ebecryl ® 150, UCB, Belgium),
23 parts of Irgalith Blue ® GLSM (from Ciba-Geigy AG, Basle).

The mixture is homogenised on a 3-roll mill and ground down to a particle size of <5μ.

Portions of 5 g of this printing ink are each homogeneously mixed with the desired amount of photoinitiator on a water-cooled pan grinder under a pressure of 180 kg/m$^2$.

This printing ink is used to prepare offset prints with a sample-printing machine (supplied by Prüfbau, West Germany) on 4×20 cm strips of glazed paper. The printing conditions are
Weight of printing ink applied: 1.5 g/m$^2$
Contact pressure: 25 kg/cm$^2$
Printing speed: 1 m/sec
The printing roll used has a metal (aluminium) surface.

The printed samples are cured in a PPG UV irradiator, once with one 80 W/cm lamp and once with two 80 W/cm lamps. Other samples are cured in an irradiator supplied by Fusion Systems (USA) with a D-lamp whose emission spectrum is at a higher wavelength than that of the PPG lamps. The irradiation time is varied by varying the transport speed of the sample.

Immediately after the irradiation the surface dryness of the printing ink is tested in the transfer test. In this test, a white sheet of paper is pressed against the printed sample under a pressure of 25 kg/cm$^2$. If no ink is transferred to the paper the test has been passed. If visible amounts of ink are transferred to the test strip, this is a sign that the surface of the sample has not been sufficiently cured.

Tables 5a–5c give the maximum transport speed at which the transfer test was still passed.

To test the in-depth curing of the printing ink, offset prints are likewise prepared as described above, except that printing rolls with a rubber surface are used and printing takes place onto the metallic face of aluminium-coated strips of paper.

Irradiation is effected as described above. Immediately after the exposure to irradiation the in-depth curing is tested in an REL in-depth curing tester. A cloth-covered aluminium cylinder is placed on the printed sample and is rotated once about its axis under a pressure of 220 g/cm² in the course of 10 seconds. If this has the effect of causing visible damage to the sample, the printing ink has not been sufficiently cured. The tables give the maximum transport speed at which the REL test was still passed.

TABLE 5a

Curing in the PPG machine with an 80 W/cm lamp

| Photo-initiator | Photo-sensitiser | Maximum transport speed (m/min) | |
|---|---|---|---|
| | | Transfer Test | REL Test |
| 2% PI 5 | — | 50 | 30 |
| 2% PI 5 | 0.5% PS 1 | 50 | 40 |
| 2% PI 5 | 0.5% PS 5 | 50 | 30 |
| 3% PI 5 | — | 70 | 40 |
| 3% PI 5 | 0.5% PS 5 | 80 | 50 |
| 3% PI 5 | 1% PS 5 | 110 | 60 |

TABLE 5b

Curing in the PPG machine with an 160 W/cm lamp

| Photo-initiator | Photo-sensitiser | Maximum transport speed (m/min) | |
|---|---|---|---|
| | | Transfer Test | REL Test |
| 2% PI 5 | — | 90 | 50 |
| 2% PI 5 | 0.5% PS 1 | 100 | 80 |
| 2% PI 5 | 0.5% PS 5 | 100 | 70 |
| 3% PI 5 | — | 130 | 90 |
| 3% PI 5 | 0.5% PS 5 | 140 | 100 |
| 3% PI 5 | 1% PS 5 | 170 | 130 |

TABLE 5c

Curing with Fusion D-lamp

| Photo-initiator | Photo-sensitiser | Maximum transport speed (m/min) | |
|---|---|---|---|
| | | Transfer Test | REL Test |
| 2% PI 5 | — | 60 | 40 |
| 2% PI 5 | 0.5% PS 1 | 70 | 90 |
| 2% PI 5 | 0.5% PS 5 | 60 | 80 |
| 3% PI 5 | — | 120 | 80 |
| 3% PI 5 | 0.5% PS 5 | 140 | 100 |
| 3% PI 5 | 1% PS 5 | 170 | 130 |

Example 6

The blue printing ink described in Example 5 is mixed with both 3% and 6% of the photoinitiators listed in Table 6. The samples are prepared and tested as described in Example 5. They are cured with a lamp power of 160 w/cm in a FPG machine.

TABLE 6

| Photoinitiator | Maximum transport speed (m/min) | |
|---|---|---|
| | Transfer test | REL Test |
| 3% PI 6 | 70 | 40 |
| 6% PI 6 | >170 | 170 |
| 3% PI 7 | >170 | 120 |
| 6% PI 7 | >170 | >170 |
| 3% PI 10 | >170 | 100 |
| 6% PI 10 | >170 | 170 |
| 3% PI 11 | 120 | 60 |
| 6% PI 11 | >170 | 110 |
| 3% PI 12 | 30 | 20 |
| 6% PI 12 | 100 | 60 |

What is claimed is:

1. A compound of formula I

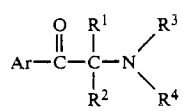

in which

Ar is phenyl substituted in the 4-position by di(C$_1$-C$_4$-alkyl)amino or

R$^1$ and R$^2$ are independently C$_1$-C$_4$-alkyl, and

R$^3$ and R$^4$ are each C$_1$-C$_4$-alkyl or 2-methoxyethyl, or

R$^3$ and R$^4$ together with the N-atom to which they are attached are morpholino.

2. The compound according to claim 1 which is 2-methyl-1-(4-dimethylaminophenyl)-2-dimethylaminopropan-1-one.

3. The compound according to claim 1 which is 2-methyl-1-(4-diethylaminophenyl)-2-diethylaminopropan-1-one.

4. The compound according to claim 1 which is 2-methyl-1-(4-dimethylaminophenykl)-2-dimethylaminobutan-1-one.

5. The compound according to claim 1 which is 2-methyl-1-(4-morpholinophenyl)-2-di(2-methoxyethyl)aminopropan-1-one.

* * * * *

UNITED STATES PATENT AND TRADEMARK OFFICE
CERTIFICATE OF CORRECTION

PATENT NO. : 4,992,547
DATED : FEBRUARY 12, 1991
INVENTOR(S) : GODWIN BERNER, ET AL.

It is certified that error appears in the above-identified patent and that said Letters Patent is hereby corrected as shown below:

Column 24, line 29:
    Claim 1, line 5 the term --morpholino,-- should be inserted after "or".

Signed and Sealed this

Twenty-eighth Day of July, 1992

Attest:

DOUGLAS B. COMER

*Attesting Officer*    *Acting Commissioner of Patents and Trademarks*